(12) United States Patent
Udagawa

(10) Patent No.: US 7,594,801 B2
(45) Date of Patent: Sep. 29, 2009

(54) CHEMICAL LIQUID APPARATUS AND DEAERATING METHOD

(75) Inventor: Seiichiro Udagawa, Tokyo (JP)

(73) Assignee: Koganei Corporation, Tokyo (JP)

( * ) Notice: Subject to any disclaimer, the term of this patent is extended or adjusted under 35 U.S.C. 154(b) by 528 days.

(21) Appl. No.: 10/500,121

(22) PCT Filed: Dec. 6, 2002

(86) PCT No.: PCT/JP02/12822

§ 371 (c)(1),
(2), (4) Date: Jun. 25, 2004

(87) PCT Pub. No.: WO03/059486

PCT Pub. Date: Jul. 24, 2003

(65) Prior Publication Data

US 2005/0175472 A1    Aug. 11, 2005

(30) Foreign Application Priority Data

Dec. 27, 2001   (JP) ............................. 2001-397706

(51) Int. Cl.
*F04D 9/00* (2006.01)
(52) U.S. Cl. .................. 417/53; 417/278; 417/313; 417/572; 95/241; 95/260; 95/266; 96/155; 96/193; 96/194; 96/219
(58) Field of Classification Search ................ 210/767; 417/278, 53, 313, 572; 95/241, 260, 266; 96/155, 193, 194, 219
See application file for complete search history.

(56) References Cited

U.S. PATENT DOCUMENTS 3,713,274 A   1/1973   Sauer et al. .................. 55/164

| 3,777,888 A | 12/1973 | Zellbeck, et al. |
| 3,910,462 A | 10/1975 | Abeles, et al. |
| 3,926,664 A | 12/1975 | Verreydt .................... 134/21 |
| 4,236,881 A | 12/1980 | Pfleger ...................... 417/502 |

(Continued)

FOREIGN PATENT DOCUMENTS

EP       1195524 A2    4/2002

(Continued)

OTHER PUBLICATIONS

Copy of Japanese Office Action.

(Continued)

*Primary Examiner*—Devon C. Karmer
*Assistant Examiner*—Leonard J Weinstein
(74) *Attorney, Agent, or Firm*—McCormick, Paulding & Huber LLP

(57) ABSTRACT

The amount of chemical liquids dispensed by a chemical liquid supply apparatus is stabilized and dispensing accuracy is remarkably improved. A pump discharges a liquid accommodated in a liquid tank. A filter is connected to the pump through a pump outlet flow path to which a pump discharge-side valve for opening/closing the flow path is provided. A dispensing nozzle (liquid dispense portion) is connected to the filter through a liquid discharge flow path to which a discharge valve for opening/closing the flow path is provided. A vacuum source communicates with the filter through an exhaust flow path to which a deaeration valve for opening/closing the flow path is provided.

2 Claims, 8 Drawing Sheets

U.S. PATENT DOCUMENTS

| | | | |
|---|---|---|---|
| 4,321,014 A | 3/1982 | Eburn, Jr. et al. | |
| 4,475,666 A | 10/1984 | Bilbrey et al. | |
| 4,523,903 A | 6/1985 | Arens | 417/489 |
| 4,582,598 A | 4/1986 | Bilstad et al. | |
| 4,601,409 A | 7/1986 | DiRegolo | 222/1 |
| 4,618,425 A | 10/1986 | Yates | |
| 4,624,625 A | 11/1986 | Schrenker | |
| 4,627,235 A | 12/1986 | Kindermann et al. | |
| 4,660,741 A | 4/1987 | Kirschner et al. | |
| 4,676,905 A | 6/1987 | Nagao et al. | |
| 4,749,476 A | 6/1988 | Storkebaum et al. | |
| 4,865,525 A | 9/1989 | Kern | 417/307 |
| 4,915,597 A | 4/1990 | Moore | 417/313 |
| 4,935,151 A * | 6/1990 | Do | 210/739 |
| 4,950,134 A | 8/1990 | Bailey et al. | 417/383 |
| 4,955,992 A | 9/1990 | Goodale et al. | 55/160 |
| 5,061,156 A | 10/1991 | Kuehne et al. | |
| 5,096,602 A | 3/1992 | Yamauchi et al. | 210/767 |
| 5,167,837 A | 12/1992 | Snodgrass et al. | 210/767 |
| 5,262,068 A | 11/1993 | Bowers et al. | 210/767 |
| 5,293,893 A | 3/1994 | O'Dougherty | |
| 5,316,181 A | 5/1994 | Burch | |
| 5,344,044 A | 9/1994 | Hayden et al. | |
| 5,383,574 A | 1/1995 | Raphael | 222/1 |
| 5,383,958 A | 1/1995 | Battaglia | 96/188 |
| 5,425,803 A | 6/1995 | van Schravendijk et al. | 95/46 |
| 5,490,611 A | 2/1996 | Bernosky et al. | |
| 5,490,765 A | 2/1996 | Bailey et al. | 417/2 |
| 5,516,429 A | 5/1996 | Snodgrass et al. | 210/767 |
| 5,527,161 A | 6/1996 | Bailey et al. | 417/53 |
| 5,590,686 A | 1/1997 | Prendergast | 137/597 |
| 5,607,000 A | 3/1997 | Cripe et al. | |
| 5,636,762 A | 6/1997 | Juhola et al. | 222/1 |
| 5,645,625 A | 7/1997 | van Schravendijk et al. | 95/46 |
| 5,658,615 A | 8/1997 | Hasebe et al. | 427/240 |
| 5,762,795 A | 6/1998 | Bailey et al. | 210/416.1 |
| 5,772,899 A | 6/1998 | Snodgrass et al. | 210/767 |
| 5,792,237 A | 8/1998 | Hung et al. | 95/24 |
| 5,858,466 A | 1/1999 | Liu et al. | 427/294 |
| 5,868,278 A | 2/1999 | Chen | |
| 5,878,918 A | 3/1999 | Liao et al. | |
| 5,900,045 A * | 5/1999 | Wang et al. | 95/241 |
| 5,971,723 A | 10/1999 | Bolt et al. | 417/413.1 |
| 5,989,317 A | 11/1999 | Huang et al. | 95/241 |
| 6,012,607 A | 1/2000 | Hsu et al. | |
| 6,024,249 A | 2/2000 | On | 222/52 |
| 6,062,442 A | 5/2000 | Yang et al. | |
| 6,098,843 A | 8/2000 | Soberanis et al. | |
| 6,105,829 A | 8/2000 | Snodgrass et al. | 222/214 |
| 6,171,367 B1 * | 1/2001 | Peng et al. | 95/46 |
| 6,190,565 B1 | 2/2001 | Bailey et al. | 210/744 |
| 6,193,783 B1 | 2/2001 | Sakamoto et al. | 95/26 |
| 6,238,576 B1 * | 5/2001 | Yajima | 210/767 |
| 6,245,148 B1 | 6/2001 | Liang et al. | |
| 6,251,293 B1 | 6/2001 | Snodgrass et al. | 210/767 |
| 6,269,975 B2 | 8/2001 | Soberanis et al. | |
| 6,325,932 B1 | 12/2001 | Gibson | 210/416.1 |
| 6,332,924 B1 | 12/2001 | Shim et al. | 118/684 |
| 6,336,959 B1 | 1/2002 | Kamo | 95/241 |
| 6,338,361 B2 | 1/2002 | Kao et al. | |
| 6,340,098 B2 | 1/2002 | Soberanis et al. | |
| 6,378,907 B1 | 4/2002 | Campbell et al. | 285/26 |
| 6,431,258 B1 | 8/2002 | Konishi et al. | 165/46 |
| 6,432,300 B2 | 8/2002 | Larkner et al. | 210/87 |
| 6,491,742 B1 * | 12/2002 | Johnson | 95/241 |
| 6,500,242 B2 | 12/2002 | Fu et al. | 96/157 |
| 6,539,986 B2 * | 4/2003 | Yajima | 141/2 |
| 6,554,579 B2 | 4/2003 | Martin et al. | 417/53 |
| 6,585,885 B2 | 7/2003 | Larkner et al. | 210/87 |
| 6,612,505 B2 | 9/2003 | Shyu | 239/11 |
| 6,635,183 B2 | 10/2003 | Gibson | 210/767 |
| 6,641,670 B2 | 11/2003 | Tsujii et al. | |
| 6,675,987 B2 | 1/2004 | Soberunie et al. | |
| 6,726,774 B2 | 4/2004 | Tzeng et al. | |
| 6,733,250 B2 | 5/2004 | Yajima | 417/313 |
| 6,752,599 B2 | 6/2004 | Park | 417/46 |
| 6,783,803 B2 | 8/2004 | Tsujii et al. | |
| 6,817,486 B2 | 11/2004 | Yang | |
| 7,007,822 B2 | 3/2006 | Forshey et al. | |
| 7,018,472 B2 | 3/2006 | Yamauchi | |
| 7,078,355 B2 | 7/2006 | Nguyen | |
| 7,237,581 B2 | 7/2007 | Jang | |
| 2002/0041312 A1 | 4/2002 | Yajima | |
| 2002/0131875 A1 | 9/2002 | Yajima | |
| 2004/0144736 A1 | 7/2004 | Yajima | 210/805 |
| 2005/0238504 A1 | 10/2005 | Yajima | |
| 2008/0011781 A1 | 1/2008 | Yajima | |

FOREIGN PATENT DOCUMENTS

| | | |
|---|---|---|
| EP | 1240932 A2 | 9/2002 |
| JP | 62140423 A | 6/1987 |
| JP | 53-110636 A | 5/1988 |
| JP | 02281727 A | 11/1990 |
| JP | 4-18958 | 1/1992 |
| JP | 5-9636 | 2/1993 |
| JP | 5-103921 A | 4/1993 |
| JP | 09299862 A | 11/1997 |
| JP | 10-061558 | 3/1998 |
| JP | 11-47670 | 2/1999 |
| JP | 11230048 A | 8/1999 |
| JP | 2000120530 A | 4/2000 |
| JP | 20002113406 A | 4/2002 |
| JP | 2002273113 A | 9/2002 |
| JP | 2003148353 A | 5/2003 |
| JP | 2003197513 A | 7/2003 |
| JP | 2005083337 A | 3/2005 |
| WO | WO03/057343 A1 | 7/2003 |

OTHER PUBLICATIONS

Office Action dated Jan. 10, 2008 from corresponding U.S. Appl. No. 10/477,933, filed on Nov. 14, 2003.

\* cited by examiner

SUCKING OPERATION

DISCHARGING OPERATION

SUCKING OPERATION

EXHAUSTING OPERATION

CHEMICAL LIQUID APPARATUS AND DEAERATING METHOD

TECHNICAL FIELD OF THE INVENTION

The present invention relates to a chemical liquid supply apparatus for discharging a predetermined amount of liquids such as chemical liquids and, for example, to a chemical liquid supply apparatus and a deaerating method therefor, which are suitably used for coating a photoresist liquid on a surface of a semiconductor wafer.

BACKGROUND OF THE INVENTION

In each manufacturing process of various kinds of technical fields such as a semiconductor wafer manufacturing technique, a liquid crystal display manufacturing technique, a magnetic disk manufacturing technique, and a multilayer printed circuit board manufacturing technique, there has been used a chemical liquid such as a photoresist liquid, spin-on glass liquid, polyimide resin liquid, purified water, developer, etchant, cleaning liquid, or organic solvent, and a chemical liquid supply apparatus is used for coating such chemical liquid. For example, as such, a chemical liquid supply apparatus disclosed in U.S. Pat. No. 5,061,156 has been already developed.

For example, in the case of coating the photoresist liquid to the surface of the semiconductor wafer, while the semiconductor wafer is rotated in a horizontal plane, the photoresist liquid is dropped on the surface of the semiconductor wafer from a dispensing nozzle. In such a chemical liquid supply apparatus, a filter is provided to remove foreign matters contained in the photoresist liquid.

If bubbles are mixed in the apparatus in dispensing the chemical liquid such as a photoresist liquid, the bubbles absorb pressure extruding the chemical liquid and the dispense amount of the chemical liquid becomes unsteady, whereby dispense accuracy thereof is reduced. Therefore, the removal of the bubbles is required to manufacture, with high quality and good yield, integrated circuits formed on the semiconductor wafer.

In the case of a chemical liquid supply apparatus dispensing the chemical liquid by discharge pressure of a pump therein, the bubbles collected in pump volume are ordinarily exhausted to the outside of the chemical liquid supply apparatus, by opening a deaeration valve which is attached to an exhaust flow path connected to a vent port of the filter. In such a manner, the bubbles collected in the filter can be removed to a certain degree.

SUMMARY OF THE INVENTION

However, in such a conventional chemical liquid supply apparatus, it has become clear to be unable to remove completely the bubbles collected in a filtration film of the filter due to matter such as flow resistance of the filtration film, and osmotic pressure of the chemical liquid. As far as the bubbles cannot be exhausted completely from the inside of the filtration film of the filter, it is difficult to dispense stably the chemical liquid and improve the dispensing accuracy. Accordingly, the improved manufacture yield of products is not expected.

An object of the present invention is to stabilize the amount of chemical liquid dispensed from the chemical liquid supply apparatus and to improve remarkably the dispensing accuracy.

Another object of the present invention is to manufacture semiconductor integrated circuits with high quality and good yield.

A chemical liquid supply apparatus according to the present invention comprises: a pump discharging a liquid accommodated in a liquid tank; a filter connected to said pump through a pump outlet flow path to which a pump discharge-side valve for opening/closing the flow path is provided; a liquid discharge portion connected to said filter through a liquid discharge flow path to which a discharge valve for opening/closing the flow path is provided; and a vacuum source communicating with said filter through an exhaust flow path to which a deaeration valve for opening/closing the flow path is provided.

The chemical liquid supply apparatus according to the present invention further comprises a control means for closing said pump discharge-side valve and said discharge valve and opening said deaeration valve while said vacuum source is operating. Also, said exhaust flow path is connected to any one of a vent port formed at said filter, or a primary or secondary side of said filter.

Additionally, a deaerating method of a chemical liquid supply apparatus according to the present invention, the apparatus having a pump discharging a liquid accommodated in a liquid tank, a filter connected to said pump through a pump outlet flow path to which a pump discharge-side valve for opening/closing the flow path is provided, and a liquid discharge portion connected to said filter through a liquid discharge flow path to which a discharge valve for opening/closing the flow path is provided, and dispensing the liquid accommodated in said liquid tank from said liquid dispensing portion, comprises a deaerating step of, under such a state that a vacuum source connected to said filter through an exhaust flow path is operating, opening a deaeration valve provided to said exhaust flow path and closing said pump discharge-side valve and said discharge valve to exhaust a gas inside said filter to said exhaust flow path.

Another deaerating method of a chemical liquid supply apparatus according to the present invention, the apparatus having a pump communicating with a liquid accommodated in a liquid tank through a liquid introduction flow path to which a pump inlet-side valve for opening/closing the flow path is provided, the pump discharging the liquid, a filter connected to said pump through a pump outlet flow path to which a pump discharge-side valve for opening/closing the flow path is provided, and a liquid discharge portion connected to said filter through a liquid discharge flow path to which a discharge valve for opening/closing the flow path is provided, and dispensing the liquid in said liquid tank from said liquid dispense portion, comprises the processes of: performing a sucking operation of said pump under such a state that a deaeration valve provided to an exhaust flow path communicating with an inlet side of said filter, said pump inlet-side valve and said discharge valve are closed, and that said pump discharge-side valve is opened; and performing a discharging operation of said pump under such a state that said deaeration valve and said pump discharge-side valve are opened and that said pump inlet-side valve and said discharge valve are closed.

DESCRIPTION OF PREFERRED EMBODIMENTS

Hereinafter, embodiments of the present invention will be detailed based on the drawings.

Figure 1:
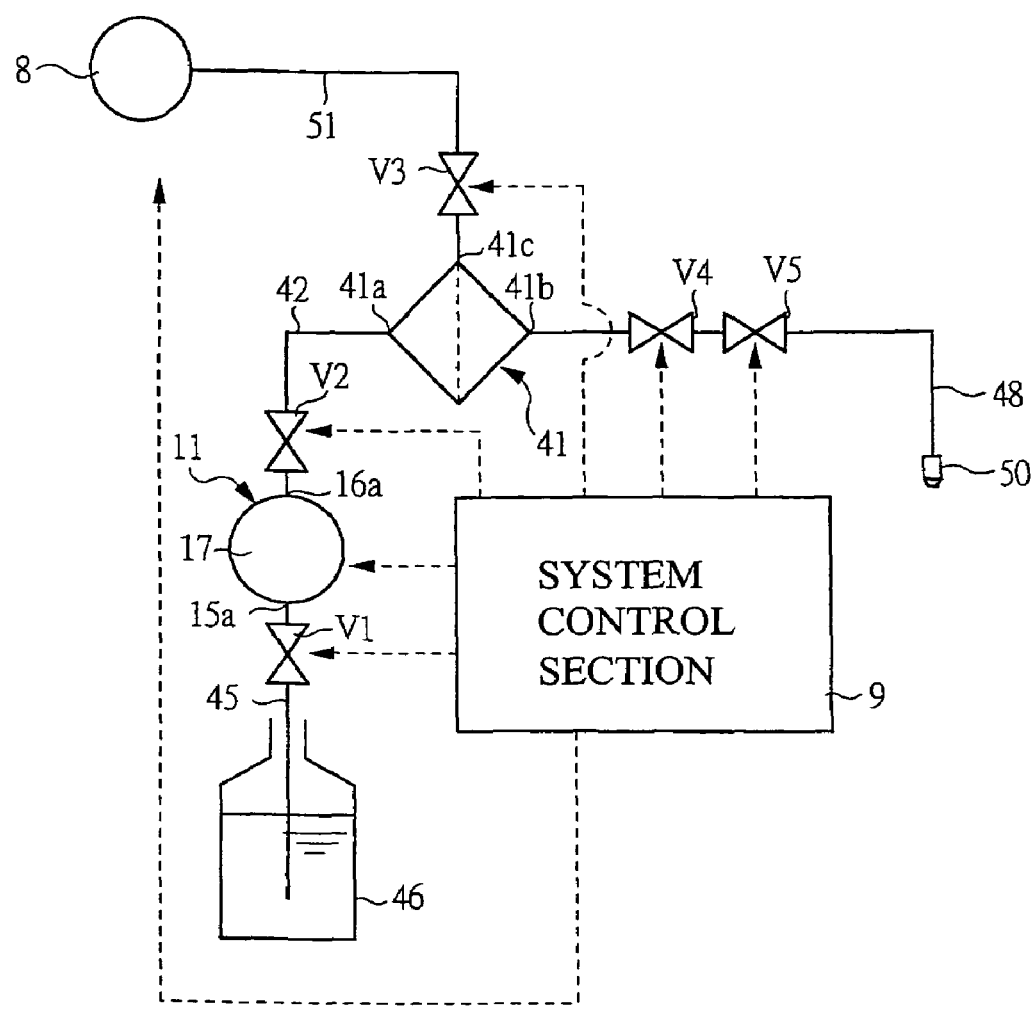
FIG. 1 is a liquid circuit diagram showing schematically a chemical liquid supply apparatus according to an embodiment of the present invention.

FIG. 1 is a liquid circuit diagram showing schematically a chemical liquid supply apparatus according to an embodiment of the present invention. As shown in FIG. 1, the chemical liquid supply apparatus comprises: a pump 11 for discharging a liquid accommodated in a liquid tank 46; a filter 41 connected to the pump 11 through a pump outlet flow path 42 to which a pump discharge-side valve V2 for opening/closing the flow path is provided; a dispensing nozzle (liquid dispense portion) 50 connected to the filter 41 through a liquid discharge flow path 48 to which a discharge valve V4 for opening/closing the flow path is provided; and a vacuum source 8 communicating with the filter 41 through an exhaust flow path 51 to which a deaeration valve V3 for opening/closing the flow path is provided. The structure of the chemical liquid supply apparatus and its components such as the pump 11, the filter 41, etc. basically similar to that disclosed in Japanese Patent Laid-open No. 10-61558 having been devised by the present applicant.

The pump 11 has an expanding/contracting pump chamber 17, a pump inlet 15a, and a pump outlet 16a. In a liquid introduction flow path 45, a pump inlet-side valve V1 for opening/closing this flow path is provided and placed so that one end thereof is connected to the pump inlet 15a of the pump 11 and the other end is put inside the liquid tank 46 accommodating a photoresist liquid.

Therefore, the pump 11 and the liquid tank 46 are connected to each other through the liquid introduction flow path 45.

The pump 11 sucks the liquid accommodated in the liquid tank 46, through the liquid introduction flow path 45 from the pump inlet 15a to an inside of the pump chamber 17 when the pump chamber 17 is expanded, and discharges the liquid from the pump outlet 16a when the pump chamber is contracted.

Since the supplied chemical liquid is the photoresist liquid, the pump 11 is made of a resin material, such as a tetrafluoroethyleneperfluoroalkylvinylether copolymer (PFA) that is a fluororesin, so as not to react with the chemical liquid. However, the resin material is not limited to the PFA, and other resin materials may be used so long as they are elastically deformed.

Further, as a type of the pump 11, a diaphragm type pump may be used so long as it is a displacement type pump.

The filter 41 has: a filter inlet 41a connected to the pump outlet flow path 42; a filter outlet 41b connected to the liquid discharge flow path 48; and a vent port 41c connected to the exhaust flow path 51.

As the filter 41, a filter formed of a hollow fiber film or a sheet-shaped film can be used but not limited thereto so long as it is capable of filtering the chemical liquid.

In the embodiment as shown in FIG. 1, the dispensing nozzle (liquid dispense portion) 50 is provided to a tip of the liquid discharge flow path 48.

As the vacuum source 8, a reciprocal or vane type vacuum pump, an ejector, or the like can be used.

In the liquid discharge flow path 48, a return valve V5 for opening/closing this flow path is provided. Note that as the valves from the pump inlet-side valve V1 to the return valve V5, a solenoid valve operated by electrical signals, an air operated valve, or the like may be used.

In the embodiment as shown in FIG. 1, to control respective operations of the pump 11, the valves from the pump inlet-side valve V1 to the return valve V5, and the vacuum source 8, a system control section 9 is provided, whereby operating signals are sent from the system control section 9 to the pump 11, the valves from the pump inlet-side valve V1 to the return valve V5, and the vacuum source 8.

Figure 2A:
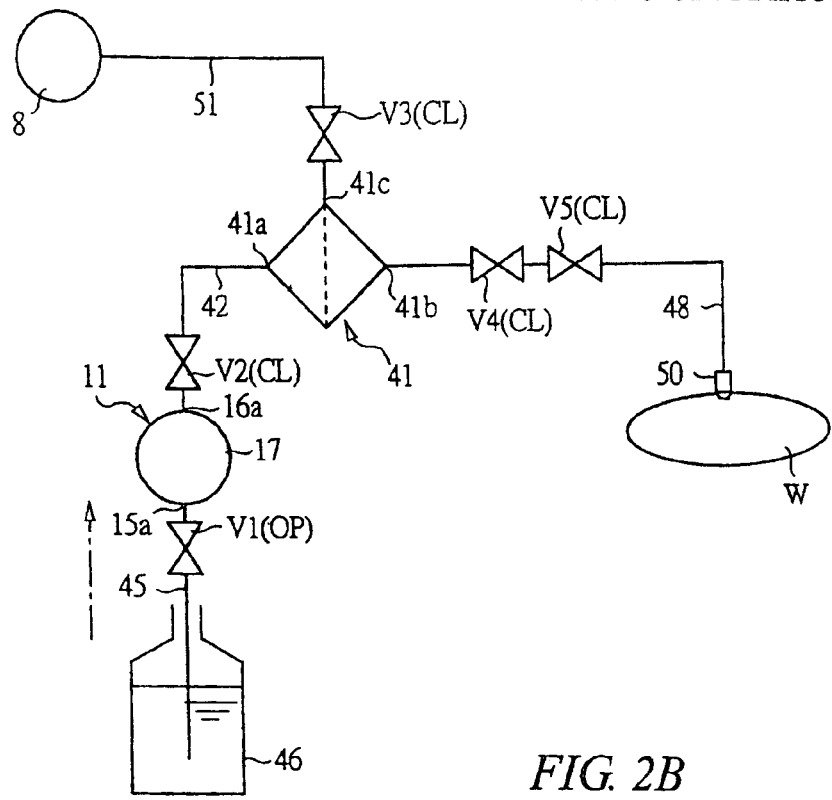
FIG. 2A is a process view showing a basic operation in the case where a liquid is dispensed by the chemical liquid supply apparatus, and shows a sucking operation.
Figure 2B:
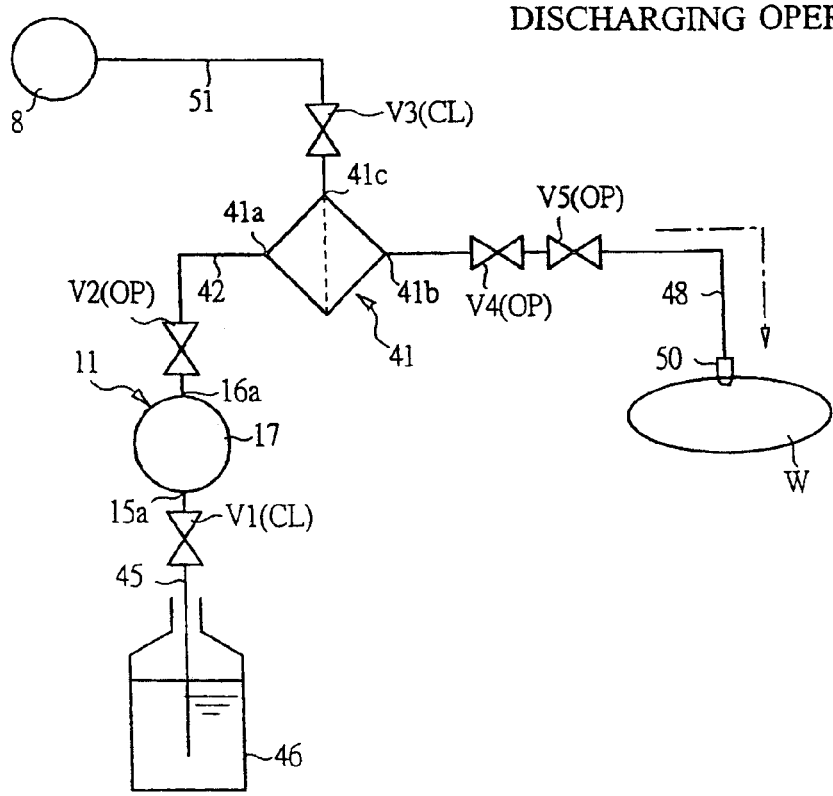
FIG. 2B is a process view showing a basic operation in the case where a liquid is dispensed by the chemical liquid supply apparatus, and shows a discharging operation.

FIGS. 2A and 2B are process views showing a basic operation in dispensing the chemical liquid by the chemical liquid supply apparatus illustrated in FIG. 1. In these Figures, the reference symbol "OP" shows that the valve is in an open state, and "CL" shows that the valve is in a close state.

To dispense the liquid, first, as shown in FIG. 2A, the pump discharge-side valve V2, the deaeration valve V3, the discharge valve V4, and the return valve V5 are closed, whereby the pump outlet flow path 42, the exhaust flow path 51, and the liquid discharge flow path 48 each become closed. Further, the pump inlet-side valve V1 is opened, whereby only the liquid introduction flow path 45 becomes opened. Under this condition, a sucking operation of the pump 11 is performed. By the sucking operation of the pump 11, the pump chamber 17 is expanded and the photoresist liquid in the liquid tank 46 is sucked into the pump chamber 17.

Next, as shown in FIG. 2B, the pump inlet-side valve V1 is closed, whereby the liquid introduction flow path 45 becomes closed. The pump discharge-side valve V2, the discharge valve V4, and the return valve V5 are opened, whereby the pump outlet flow path 42 and the liquid discharge flow path 48 each become opened. Under this condition, a discharging operation of the pump 11 is performed. By the discharge operation of the pump 11, the pump chamber 17 is contracted, so that the photoresist liquid in the pump chamber 17 is discharged from the dispensing nozzle (liquid dispense portion) 50 and is dispensed to a surface of a semiconductor wafer W.

Thus, with the sucking and discharging operations of the pump 11, the valves from the pump inlet-side valve V1 to the return valve V5 are opened/closed, whereby the respective flow paths are opened/closed. Therefore, the chemical liquid supply apparatus can perform a chemical liquid discharge/supply operation for dispensing the chemical liquid.

After the chemical liquid is dispensed, the discharge valve V4 is closed and simultaneously the operation of the pump 11 is stopped, and a suck-back operation (not shown) is performed. The suck-back operation is performed by operating the return valve V5. Due to this, the photoresist liquid enters into the dispensing nozzle (liquid dispense portion) 50, so that the liquid is prevented from dripping.

Figure 3:
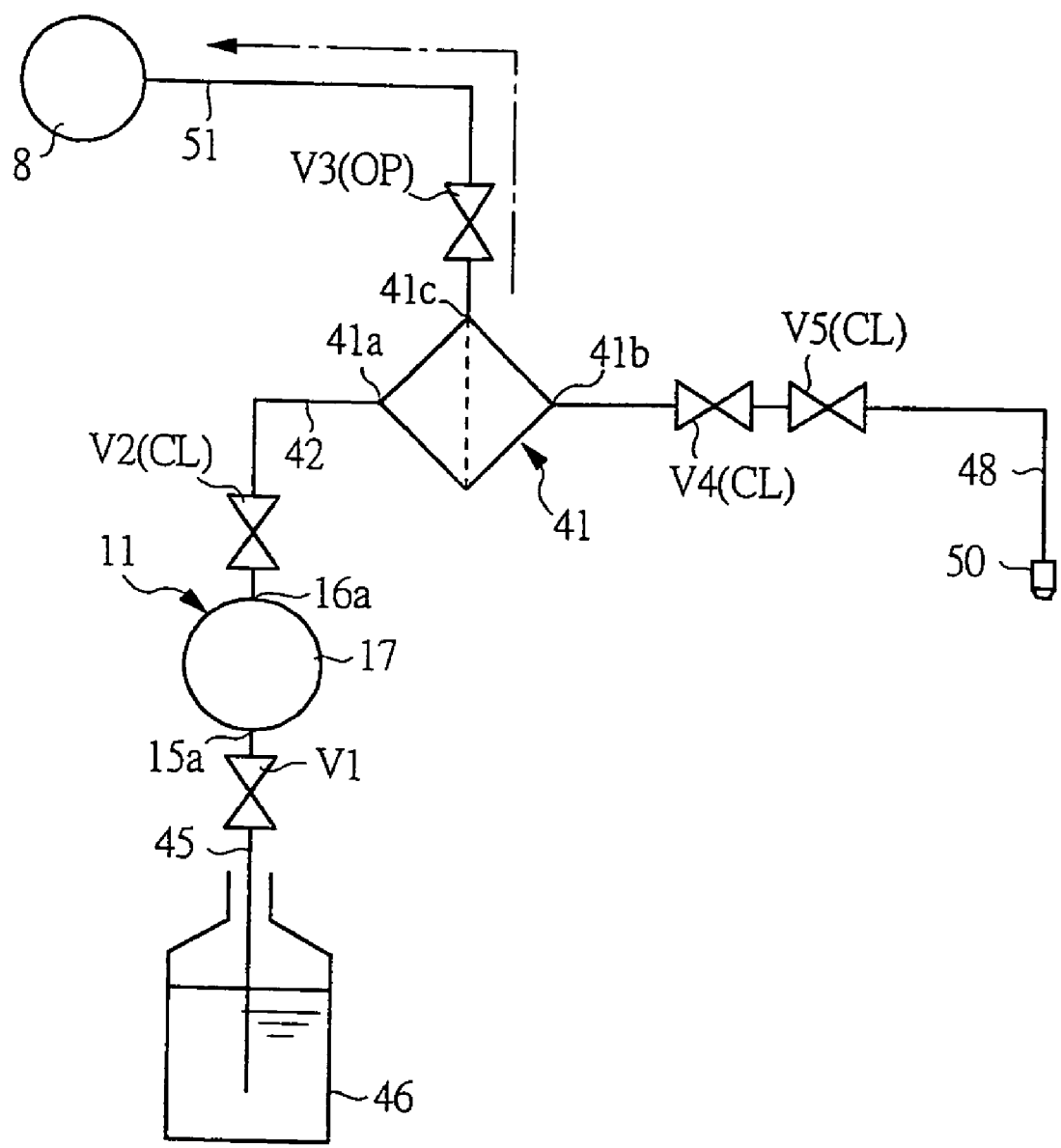
FIG. 3 is an explanatory view of a deaerating method of the chemical liquid supply apparatus of the present invention.

FIG. 3 is an explanatory view of a deaerating method of the chemical liquid supply apparatus according to the present invention. First, the pump discharge-side valve V2, the discharge valve V4, and the return valve V5 are closed, whereby the pump outlet flow path 42 and the liquid discharge flow path 48 each become closed. The deaeration valve V3 is opened, whereby the liquid introduction flow path 45 becomes closed. Under this condition, the vacuum source 8 is operated. By doing so, the bubbles collected inside the filtration film of the filter 41 can be removed completely. Therefore, it is possible to dispense stably the chemical liquid and improve remarkably the dispensing accuracy, and consequently to manufacture semiconductor integrated circuits with high quality and good yield.

Hereinafter, a chemical liquid supply apparatus other than that of the embodiment as shown in FIG. 1 will be illustrated. In Figures described later, the same components as those shown in FIG. 1 are denoted by the same reference symbols.

Figure 4:
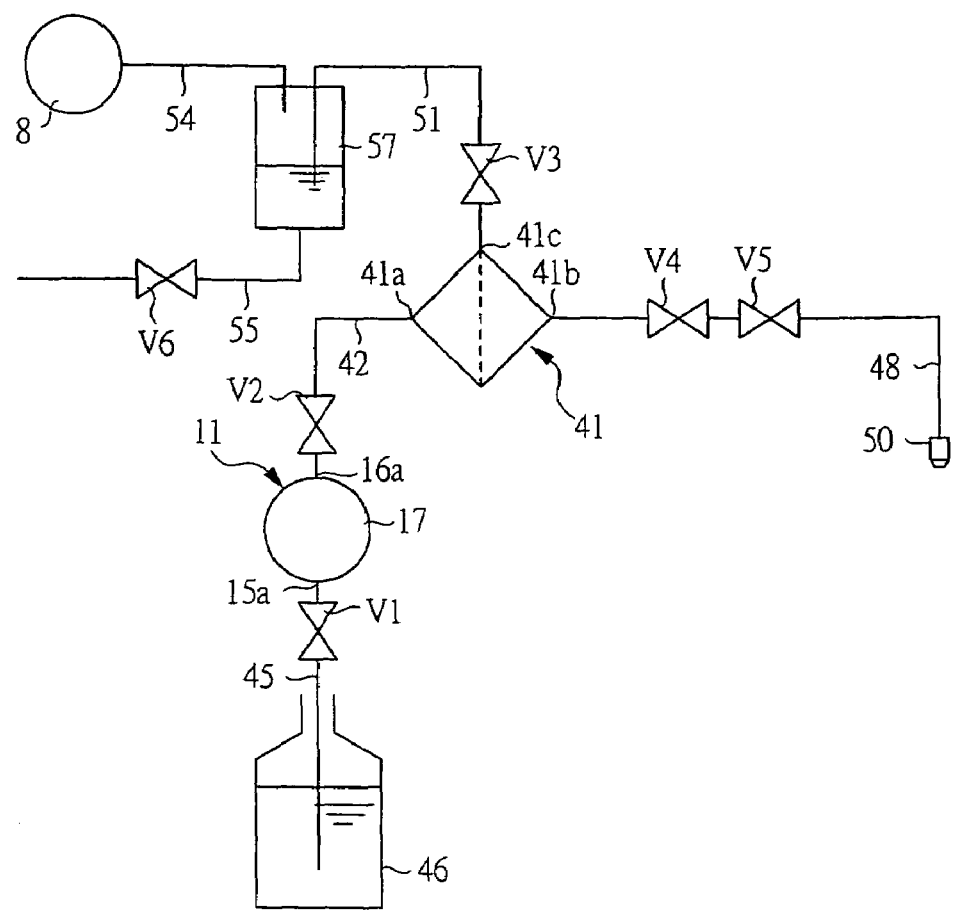
FIG. 4 is a liquid circuit diagram showing schematically a chemical liquid supply apparatus according to another embodiment of the present invention.

FIG. 4 is a liquid circuit diagram showing schematically a chemical liquid supply apparatus according to another embodiment of the present invention. The chemical liquid supply apparatus shown in FIG. 4 is characterized in that a buffer tank 57 is placed between the filter 41 and the vacuum source 8.

As shown in FIG. 4, the buffer tank 57 is such that the inside thereof accumulates the photoresist liquid and the bottom is provided with a liquid exhaust flow path 55. The exhaust flow path 51 extending from the vent port 41c of the filter 41 is placed so that a tip thereof is put below a liquid level of the photoresist liquid in the buffer tank 57. An exhaust flow path 54 is placed so that one end thereof is put above the liquid level of the photoresist liquid in the buffer tank 57 and the other end is connected to the vacuum source 8.

Accordingly, the filter 41 and the buffer tank 57 are connected to each other through the exhaust flow path 51, and the buffer tank 57 and the vacuum source 8 are connected to each other through the exhaust flow path 54. By operating the vacuum source 8, if the inside of the buffer tank 57 is filled with the photoresist liquid, a discharge valve V6 is opened to discharge the photoresist liquid.

The case of the embodiment shown in FIG. 4 also has basically the same structure as that shown in FIG. 1 in that the bubbles in the filter 41 can be removed from the exhaust flow path 51 connected to the vent port 41c, thereby having the same operations and effects.

Figure 5:
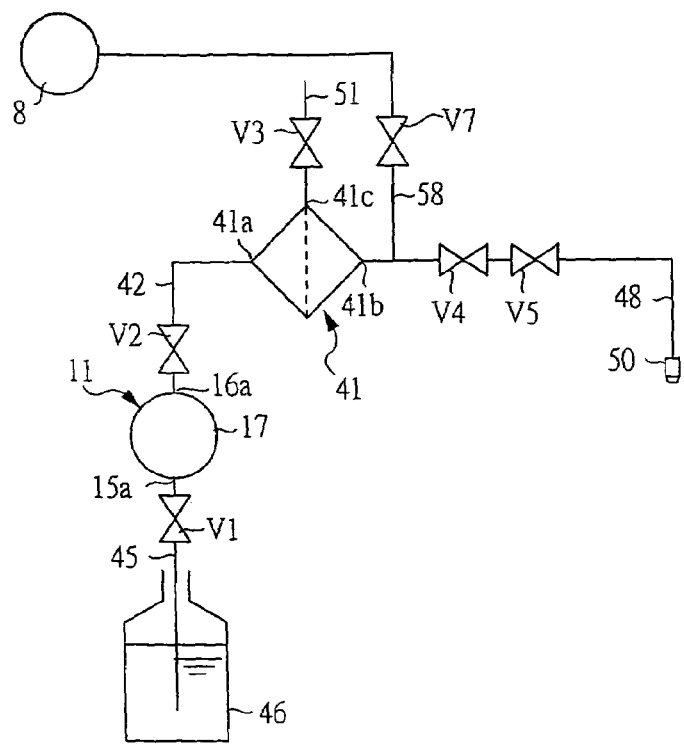
FIG. 5 is a liquid circuit diagram showing schematically a chemical liquid supply apparatus according to still another embodiment of the present invention.

FIG. 5 is a liquid circuit diagram showing schematically a chemical liquid supply apparatus according to still another embodiment of the present invention. The embodiment shown in FIG. 5 is characterized in that the vacuum source 8 is provided to a downstream side, that is, a secondary side of the filter 41. An exhaust flow path 58 is such that one end thereof is connected to a portion between the filter outlet 41b and the discharge valve V4 of the liquid discharge flow path 48 and that the other end is connected to the vacuum source 8. That is, the vacuum source 8 and the filter 41 communicate with each other through an exhaust flow path 58 to which a deaeration valve V7 for opening/closing the flow path is provided.

Also in the case of this embodiment, similarly to the embodiment shown in FIG. 1, in accordance with the sucking and discharging operations of the pump 11, the valves from the pump inlet-side valve V1 to the return valve V5 and the deaeration valve V7 are opened/closed, whereby the respective flow paths are opened/closed, and therefore, the chemical liquid supply apparatus can perform the chemical liquid discharge/supply operation for dispensing the chemical liquid.

Additionally, the valves from the pump inlet-side valve V1 to the return valve V5 are closed, whereby the pump outlet flow path 42, the liquid discharge flow path 48, and the exhaust flow path 51 each become closed. The deaeration valve V7 is opened, whereby the exhaust flow path 58 becomes opened. Under this condition, the vacuum source 8 is operated. Therefore, since the embodiment shown in FIG. 5 can remove completely the bubbles collected inside the filter 41, it has the same operations and effects as those of the chemical liquid supply apparatus shown in FIG. 1.

Figure 6:
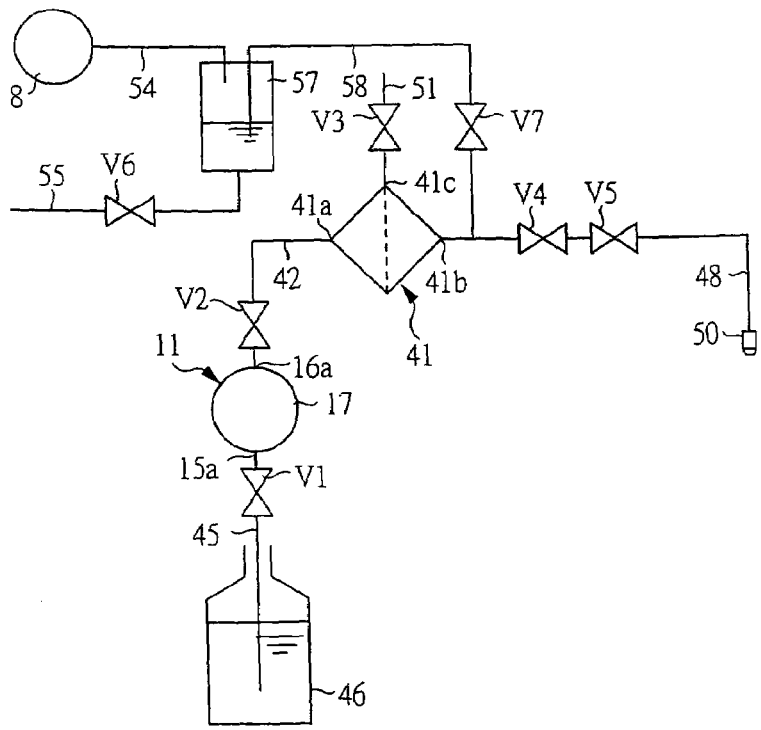
FIG. 6 is a liquid circuit diagram showing schematically a chemical liquid supply apparatus according to still another embodiment of the present invention.

FIG. 6 is a liquid circuit diagram showing schematically a chemical liquid supply apparatus according to still another embodiment of the present invention. The case of the embodiment shown in FIG. 6 is the same as the embodiment shown in FIG. 5 in that the vacuum source 8 is provided to a downstream side, that is, a secondary side of the filter 41, and is the same as the embodiment shown in FIG. 4 in that the buffer tank 57 is provided to a primary side of the vacuum source 8. Accordingly, the embodiment shown in FIG. 6 also has the same operations and effects as those of the chemical liquid supply apparatus shown in FIG. 1.

Figure 7:
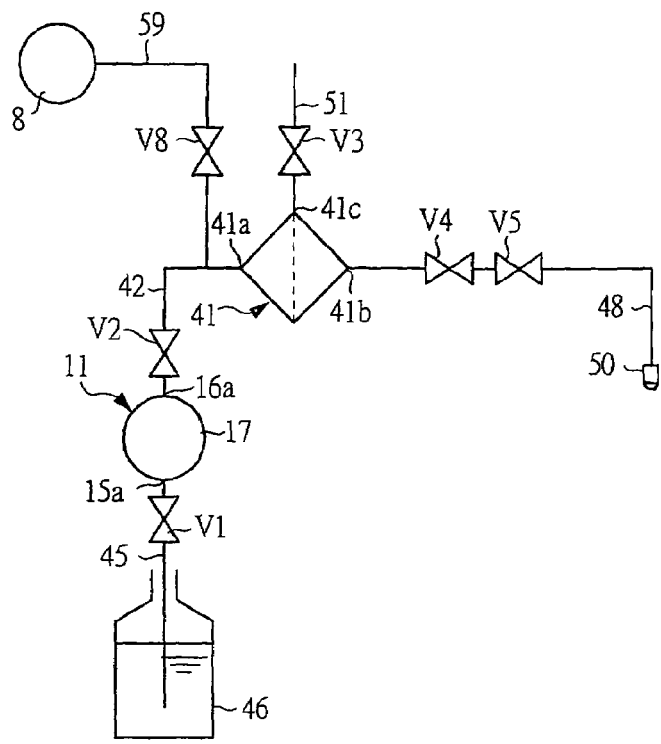
FIG. 7 is a liquid circuit diagram showing schematically a chemical liquid supply apparatus according to still another embodiment of the present invention.

FIG. 7 is a liquid circuit diagram showing schematically a chemical liquid supply apparatus according to still another embodiment of the present invention. The embodiment shown in FIG. 7 is characterized in that the vacuum source 8 is provided to an upstream side, that is, a primary side of the filter 41. An exhaust flow path 59 is such that one end thereof is connected to a portion between the filter inlet 41a and the pump discharge-side valve V2 of the pump outlet flow path 42 and the other end is connected to the vacuum source 8. That is, the vacuum source 8 and the filter 41 communicate with each other through the exhaust flow path 59.

Also in the case of this embodiment, similarly to the embodiment shown in FIG. 1, in accordance with the sucking and discharging operations of the pump 11, the valves from the pump inlet-side valve V1 to the return valve V5 and a deaeration valve V8 are opened/closed, whereby the respective flow paths are opened/closed, and therefore, this chemical liquid supply apparatus can perform the chemical liquid discharge/supply operation for dispensing the chemical liquid.

Additionally, the valves from the pump inlet-side valve V1 to the return valve V5 are closed, whereby the pump outlet flow path 42, the liquid discharge flow path 48, and the exhaust flow path 51 each become closed. The deaeration valve V8 is opened, whereby the exhaust flow path 59 becomes opened. Under this condition, the vacuum source 8 is operated. Therefore, since the embodiment shown in FIG. 7 can completely remove the bubbles collected in the filtration film of the filter 41, it has the same operations and effects as those of the chemical liquid supply apparatus shown in FIG. 1.

Figure 8:
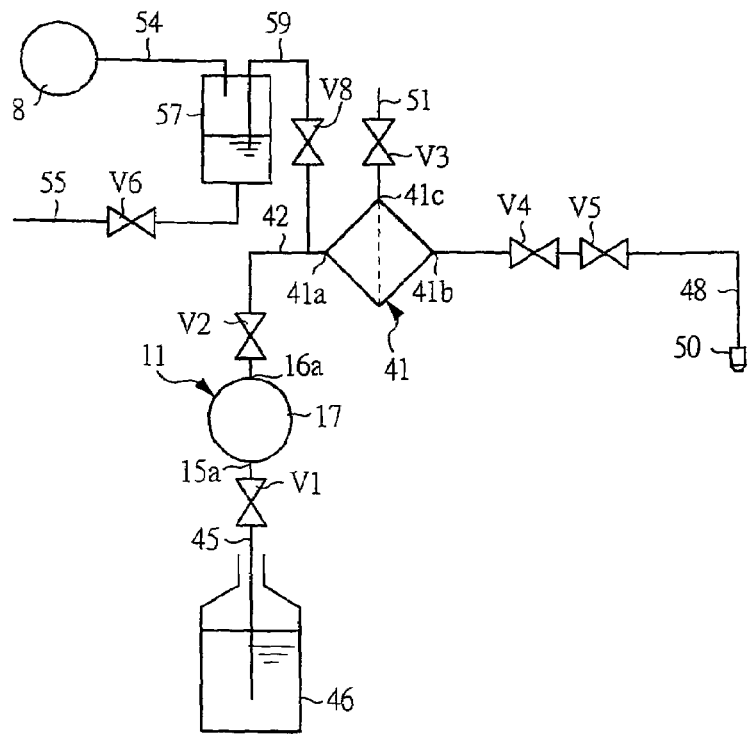
FIG. 8 is a liquid circuit diagram showing schematically a chemical liquid supply apparatus according to still another embodiment of the present invention.

FIG. 8 is a liquid circuit diagram showing schematically a chemical liquid supply apparatus according to still another embodiment of the present invention. The case of the embodiment shown in FIG. 8 is the same as the embodiment shown in FIG. 7 in that the vacuum source 8 is provided to an upstream side, that is, a primary side of the filter 41, and is the same as each of the embodiments shown in FIGS. 4 and 6 in that the buffer tank 57 is provided to the primary side of vacuum source 8. Therefore, the embodiment shown in FIG. 8 also has the same operations and effects as those of the chemical liquid supply apparatus shown in FIG. 1.

Figure 9:
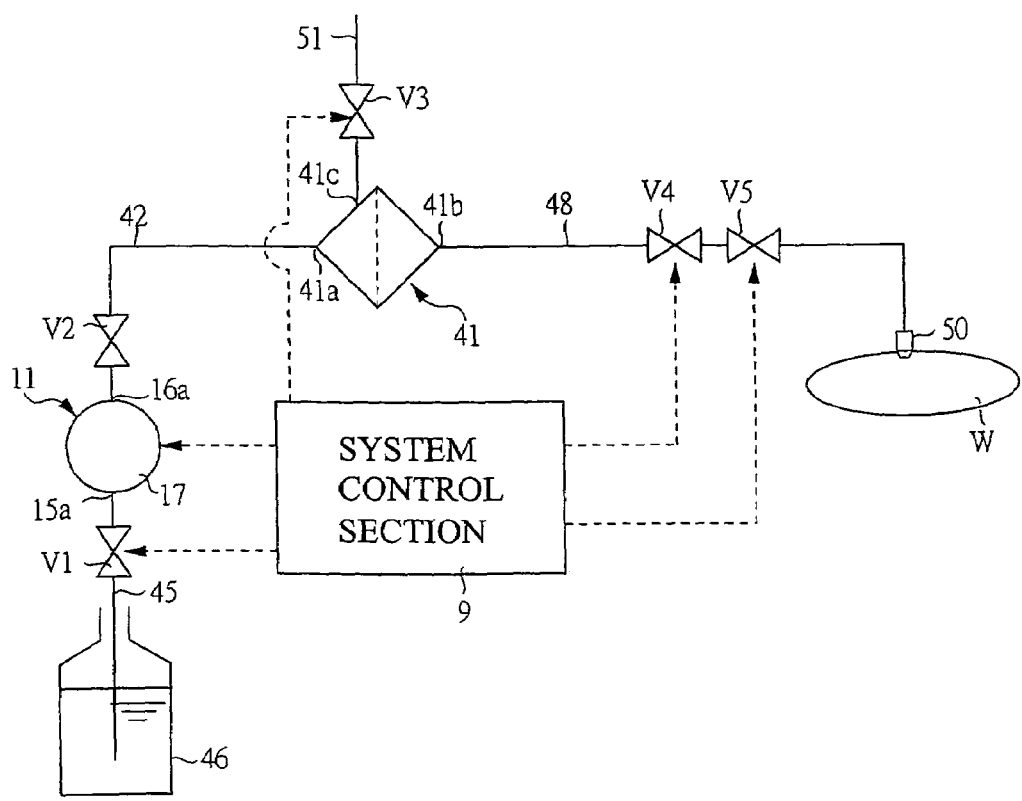
FIG. 9 is a liquid circuit diagram showing schematically a chemical liquid supply apparatus according to still another embodiment of the present invention.

FIG. 9 is a liquid circuit diagram showing schematically a chemical liquid supply apparatus according to still another embodiment of the present invention. The case of the embodiment shown in FIG. 9 is characterized in that a system control section 9 controls, without using the vacuum source, the sucking and exhausting operations of the pump 11 and each timing of opening/closing the pump outlet flow path 42, the liquid discharge flow path 48, and the exhaust flow path 51, whereby the bubbles in the filter 41 can be removed.

As shown in FIG. 9, the vent port 41c is provided to a side of the filter inlet 41a of the filter 41, and the exhaust flow path 51 is connected to the filter 41. The respective operations of the pump 11 and the valves from the pump inlet-side valve V1 to the return valve V5 are controlled by signals transmitted from the system control section 9.

Figure 10A:
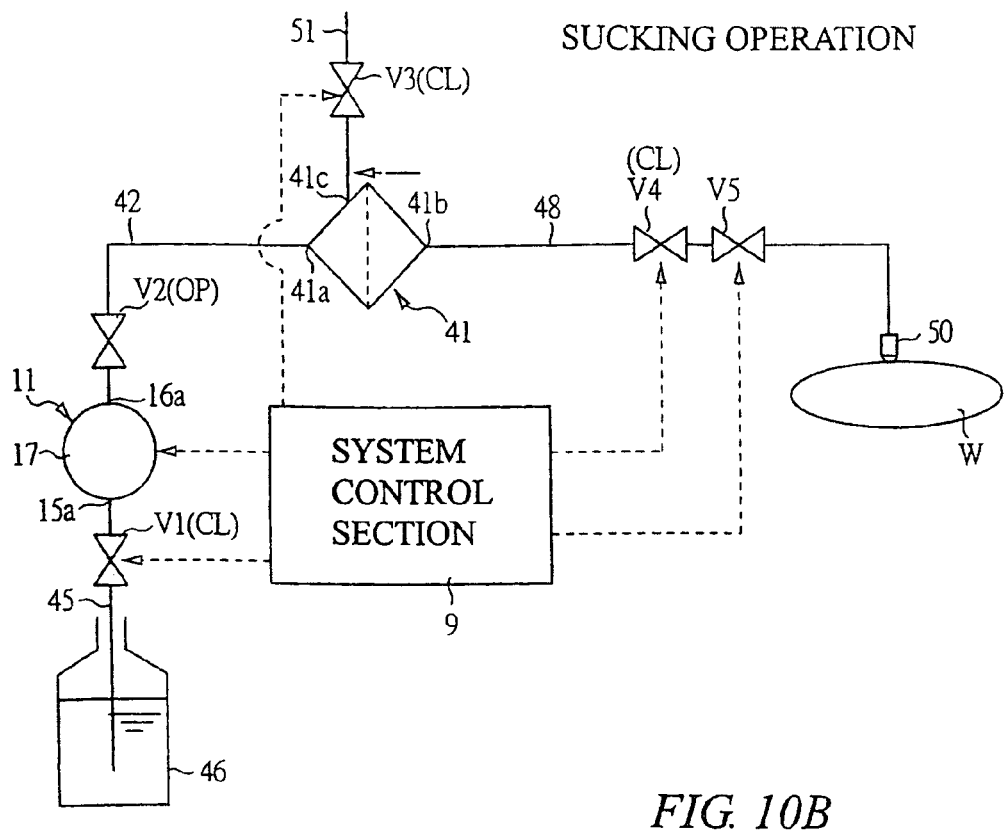
FIG. 10A is an explanatory view of a deaerating method of the chemical liquid supply apparatus as shown in FIG. 9, and shows a sucking operation.
Figure 10B:
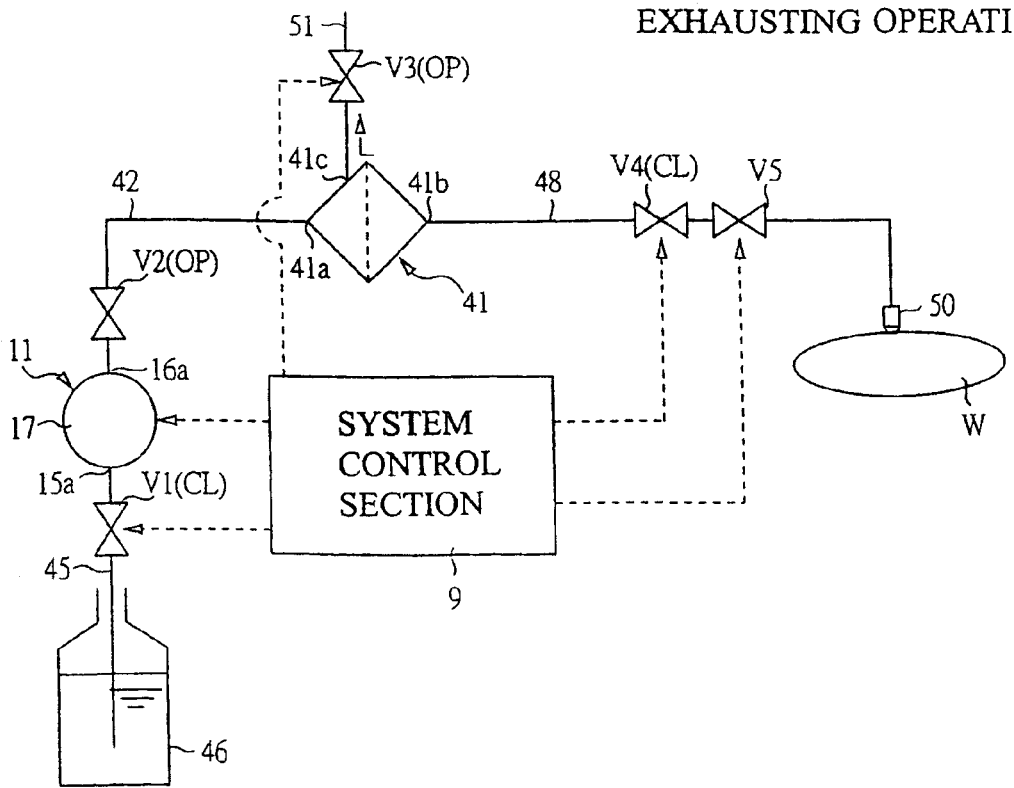
FIG. 10B is an explanatory view of a deaerating method of the chemical liquid supply apparatus as shown in FIG. 9, and shows an exhausting operation.

FIGS. 10A and 10B are explanatory views of a deaerating method of the chemical liquid supply apparatus shown in FIG. 9. A bubble-removing operation of the chemical liquid supply apparatus shown in FIG. 9 is performed in accordance with the following four processes.

In a first process, the chemical liquid discharging operation is performed. The embodiment shown in FIG. 9 has basically the same structure as that of the embodiment shown in FIG. 1, so that respective operating procedures of the pump 11 and the valves from the pump inlet-side valve V1 to the return valve V5 are the same as those shown in FIGS. 2A and 2B.

At this time, the chemical liquid supply apparatus is in such a state that the entirety thereof is filled with the chemical liquid. The bubbles collected inside the filter 41 and in each flow path are exhausted from the exhaust flow path 51 by opening the deaeration valve V3 or from the dispensing nozzle (liquid dispense portion) 50.

In a second process, as shown in FIG. 10A, the pump inlet-side valve V1, the deaeration valve V3, and the discharge valve V4 are closed, whereby the liquid introduction flow path 45, the exhaust flow path 51, and the liquid discharge flow path 48 each become closed. Further, the pump discharge-side valve V2 is opened, whereby only the pump outlet flow path 42 becomes opened. Under this condition, the sucking operation of the pump 11 is performed. The sucking operation of the pump 11 causes negative pressure, and the bubbles taken in the filtration film of the filter 41 are isolated from the filtration film and move to the side of the filter inlet 41a inside the filter 41.

In a third process, as shown in FIG. 10B, the pump inlet-side valve V1 and the discharge valve V4 are closed, whereby the liquid introduction flow path 45 and the liquid discharge flow path 48 each become closed. Further, the pump discharge-side valve V2 and the deaeration valve V3 are opened, whereby the pump outlet flow path 42 and the exhaust flow path 51 each become opened. Under this condition, the discharging operation of the pump 11 is performed. By the discharging operation of the pump 11, the bubbles that exist inside the filter 41 are moved on the side of the filter inlet 41a and are exhausted from the vent port 41c into the exhaust flow path 51. This makes it possible to remove the bubbles collected inside the filtration film of the filter 41.

In a fourth step, the chemical liquid discharging operation is performed as occasion arises, whereby the inside of the supply apparatus is always maintained in such a state that it is filled with the chemical liquid. This is because the bubbles are exhausted along with the chemical liquid.

The above-mentioned second to fourth processes are repeatedly performed until the bubbles in the filtration film of the filter 41 are removed completely.

Thus, the embodiment shown in FIG. 9 can also achieve the objects of the present invention similarly to that shown in FIG. 1.

Needless to say, the present invention is not limited to the above-described embodiments but can be variously modified and altered without departing from the gist thereof.

For example, in the above description, the case where the chemical liquid is used to dispense the photoresist liquid to the semiconductor wafer has been described. However, the present invention can be applied to supply various kinds of liquids without being limited to the photoresist liquid, and is especially effectively used in the case of filtering and dispensing a liquid in which bubbles easily occur.

According to the present invention, it is possible to stabilize the amount of the chemical liquid dispensed from the chemical liquid supply apparatus and to improve remarkably the dispensing accuracy.

INDUSTRIAL APPLICABILITY

As described above, in each manufacturing process of various kinds of technical fields such as a semiconductor wafer manufacturing technique, a liquid crystal display manufacturing technique, a magnetic disk manufacturing technique, and a multilayer printed circuit board manufacturing technique, a chemical liquid supply apparatus and a deaerating method thereof according to the present invention are effectively applied to a chemical liquid needing cleaning characteristics such as a photoresist liquid, spin-on glass liquid, polyimide resin liquid, purified water, developer, etchant, cleaning liquid, or organic solvent.

The invention claimed is:

1. A deaerating method of a chemical liquid supply apparatus having: a pump discharging a liquid by communicating with the liquid accommodated in a liquid tank through a liquid introduction flow path to which a pump inlet-side valve for opening/closing the flow path is provided; a filter connected to said pump through a pump outlet flow path provided with a pump discharge-side valve and opened/closed by said pump discharge-side valve; and a liquid dispense portion connected to said filter through a liquid discharge flow path provided with a discharge valve and opened/closed by said discharge valve, and dispensing the liquid in said liquid tank from said liquid dispense portion, the deaerating method comprising the processes of:

performing a first sucking operation of said pump for sucking said liquid from said liquid tank under such a state that said pump-inlet side valve is opened and that said pump discharge-side valve is closed;

performing, after said first sucking operation, a first discharging operation of said pump for discharging said liquid from said liquid dispense portion under such a state that said pump-inlet side valve is closed and that said pump discharge-side valve and said discharge valve are opened;

opening, after said first discharging operation, a deaeration valve provided to an exhaust flow path communicating with an inlet side of said filter to exhaust, from said exhaust flow path or said liquid dispense portion, bubbles in said filter and in each of said liquid introduction flow path, said pump outlet flow path, and said liquid discharge flow path under such a state that an inside of said chemical liquid supply apparatus is filled with said liquid;

performing a second sucking operation of said pump for causing negative pressure to isolate, from a filtration film of said filter, bubbles collected in said filtration film and to move the bubbles to said inlet side under such a state that said deaeration valve, said pump inlet-side valve, and said discharge valve are closed and that said pump discharge-side valve is opened;

performing a second discharging operation of said pump for exhausting, from said exhaust flow path, said bubbles moved on said inlet side under such a state that said deaeration valve and said pump discharge-side valve are opened and that said pump inlet-side valve and said discharge valve are closed; and dispensing said liquid from said liquid dispense portion as occasion arises, wherein the respective processes of performing said second sucking operation and said second discharging operation, while maintaining always the inside of said chemical liquid supply apparatus in a state of being filled with said liquid, are repeated until said bubbles in said filtration film are removed.

2. A chemical liquid supply apparatus comprising:

a pump discharging a liquid by communicating with the liquid accommodated in a liquid tank through a liquid introduction flow path to which a pump inlet-side valve for opening/closing the flow path is provided;

a filter connected to said pump through a pump outlet flow path provided with a pump discharge-side valve and opened/closed by said pump discharge-side valve;

a liquid dispense portion connected to said filter through a liquid discharge flow path provided with a discharge valve, the liquid in said liquid tank being dispensed from said liquid dispense portion;

an exhaust flow path provided in communication with an inlet side of said filter;

a deaeration valve provided to said exhaust flow path; and a system control section configured to close said deaeration valve, said pump inlet-side valve, and said discharge valve, open said pump discharge-side valve, and cause negative pressure to isolate, from a filtration film of said filter, bubbles collected in said filtration film and to move the bubbles to said inlet side while performing a sucking operation of said pump, and configured to open said deaeration valve and said pump discharge-side valve, close said pump inlet-side valve and said discharge valve, and exhaust, from said exhaust flow path, said bubbles moved on said inlet side while performing a discharge operation of said pump.

* * * * *

UNITED STATES PATENT AND TRADEMARK OFFICE
CERTIFICATE OF CORRECTION

PATENT NO. : 7,594,801 B2
APPLICATION NO. : 10/500121
DATED : September 29, 2009
INVENTOR(S) : Seiichiro Udagawa It is certified that error appears in the above-identified patent and that said Letters Patent is hereby corrected as shown below:

Title Page; item (56); Page 2; col. 2
Under FOREIGN PATENT DOCUMENTS on page 2 please delete "JP 53-110636 A" and replace it with "JP 63-110636 A".

Signed and Sealed this

First Day of December, 2009

David J. Kappos
*Director of the United States Patent and Trademark Office*